United States Patent
Chen et al.

(10) Patent No.: US 10,170,457 B2
(45) Date of Patent: Jan. 1, 2019

(54) COWOS STRUCTURES AND METHOD OF FORMING THE SAME

(71) Applicant: Taiwan Semiconductor Manufacturing Company, Ltd., Hsinchu (TW)

(72) Inventors: Wei-Ming Chen, Taipei (TW); Tu-Hao Yu, Hsinchu (TW); Kuo-Chiang Ting, Hsinchu (TW); Shang-Yun Hou, Jubei (TW); Chi-Hsi Wu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 15/479,735

(22) Filed: Apr. 5, 2017

(65) Prior Publication Data

US 2018/0190638 A1 Jul. 5, 2018

Related U.S. Application Data

(60) Provisional application No. 62/441,001, filed on Dec. 30, 2016.

(51) Int. Cl.
*H01L 21/00* (2006.01)
*H01L 25/00* (2006.01)
*H01L 21/48* (2006.01)
*H01L 23/498* (2006.01)
*H01L 25/18* (2006.01)
(Continued)

(52) U.S. Cl.
CPC .......... *H01L 25/50* (2013.01); *H01L 21/4803* (2013.01); *H01L 21/486* (2013.01); *H01L 21/4817* (2013.01); *H01L 21/4853* (2013.01); *H01L 21/4871* (2013.01); *H01L 21/561* (2013.01); *H01L 21/563* (2013.01); *H01L 23/3675* (2013.01); *H01L 23/49811* (2013.01); *H01L 23/49827* (2013.01); *H01L 23/49833* (2013.01); *H01L 24/16* (2013.01); *H01L 24/97* (2013.01); *H01L 25/18* (2013.01); *H01L 2224/16235* (2013.01); *H01L 2224/16238* (2013.01); *H01L 2224/95001* (2013.01); *H01L 2924/1431* (2013.01); *H01L 2924/1436* (2013.01); *H01L 2924/1437* (2013.01); *H01L 2924/1461* (2013.01); *H01L 2924/19011* (2013.01); *H01L 2924/19105* (2013.01); *H01L 2924/19106* (2013.01)

(58) Field of Classification Search
CPC ........................................................ H01L 25/50
See application file for complete search history.

(56) References Cited

U.S. PATENT DOCUMENTS

| | | | | |
|---|---|---|---|---|
| 5,396,403 A | * | 3/1995 | Patel | H01L 23/433 257/713 |
| 2012/0049339 A1 | * | 3/2012 | Wang | H01L 21/563 257/693 |
| 2013/0062760 A1 | * | 3/2013 | Hung | H01L 21/561 257/738 |

* cited by examiner

*Primary Examiner* — William Harriston
(74) *Attorney, Agent, or Firm* — Slater Matsil, LLP

(57) ABSTRACT

Chip on wafer on substrate structures and methods of forming are provided. The method includes attaching a first die and a second die to an interposer. The method also includes attaching a first substrate to a first surface of the first die and a first surface of the second die. The first substrate includes silicon. The first surface of the first side is opposite to the surface of the first die that is attached to the interposer, and the first surface of the second die is opposite to the surface of the second die that is attached to the interposer. The method includes bonding the interposer to a second substrate.

20 Claims, 18 Drawing Sheets

(51) Int. Cl.
*H01L 21/56* (2006.01)
*H01L 23/00* (2006.01)
*H01L 23/367* (2006.01)

COWOS STRUCTURES AND METHOD OF FORMING THE SAME

PRIORITY CLAIM AND CROSS-REFERENCE

This application claims priority to U.S. Provisional Application No. 62/441,001, filed on Dec. 30, 2016, which is hereby incorporated by reference in its entirety.

BACKGROUND

The semiconductor industry has experienced rapid growth due to continuous improvement in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed, and greater bandwidth, as well as lower power consumption and latency has grown recently, there has grown a need for smaller and more creative packaging techniques for semiconductor dies.

As semiconductor technologies further advance, stacked semiconductor devices, e.g., three dimensional integrated circuits (3DICs), have emerged as an effective alternative to further reduce the physical size of semiconductor devices. In a stacked semiconductor device, active circuits such as logic, memory, processor circuits, and the like are fabricated on different semiconductor wafers. Two or more semiconductor wafers may be installed or stacked on top of one another to further reduce the form factor of the semiconductor device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 5A, and 5B through 15 are cross-sectional views of intermediate stages in the forming of a semiconductor package in accordance with some embodiments.

DETAILED DESCRIPTION

Figure 1:
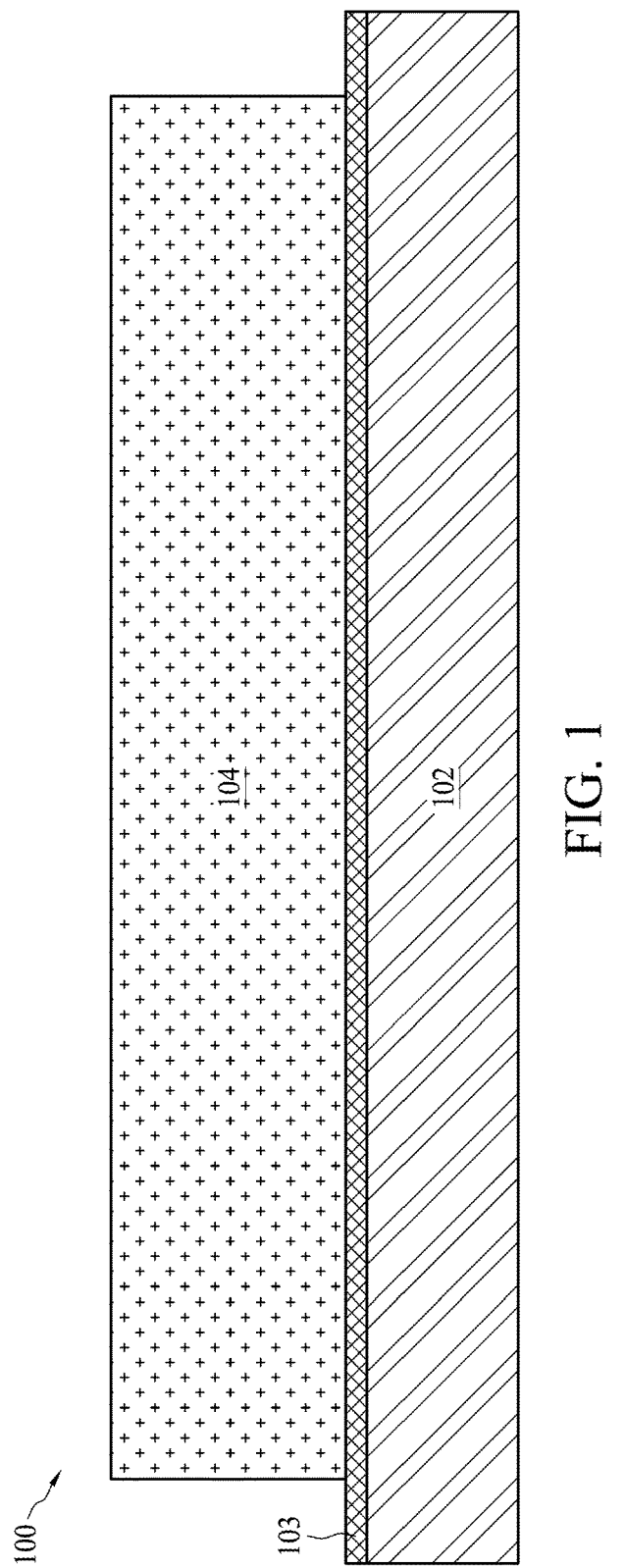

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a chip on wafer on substrate (COWOS) package 100 is provided. A substrate may be attached to a backside of dies that are packaged in the COWOS structure during manufacture. The substrate may protect the dies during manufacture, and may reduce package warpage. As such, reliability of the packages may be increased. The substrate may be used to physically support the package during manufacture, thereby reducing the need for a separate carrier and carrier debond process, which may help to reduce costs.

FIGS. 1 through 16B are cross sectional views of intermediate stages of the manufacture of a COWOS package in accordance with some embodiments. Referring to FIG. 1, substrate 104 is placed on carrier 102. Generally, carrier 102 provides temporary mechanical and structural support for various features (e.g., substrate 104) during subsequent processing steps. In this manner, damage to the device dies is reduced or prevented. Carrier 102 may comprise, for example, glass, ceramic, and the like. In some embodiments, carrier 102 may be substantially free of any active devices and/or functional circuitry. In some embodiments, release layer 103 is used to attach substrate 104 to carrier 102. Release layer 103 may be any suitable adhesive, such as an ultraviolet (UV) glue, or the like.

Substrate 104 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Substrate 104 may be an interposer. Additionally, the substrate 104 may be a SOI substrate. Generally, an SOI substrate includes a layer of a semiconductor material such as epitaxial silicon, germanium, silicon germanium, SOI, silicon germanium on insulator (SGOI), or combinations thereof. Devices, such as transistors, capacitors, resistors, diodes, and the like, may be formed in and/or on a surface of substrate 104. Substrate 104 is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for substrate 104.

Figure 2:
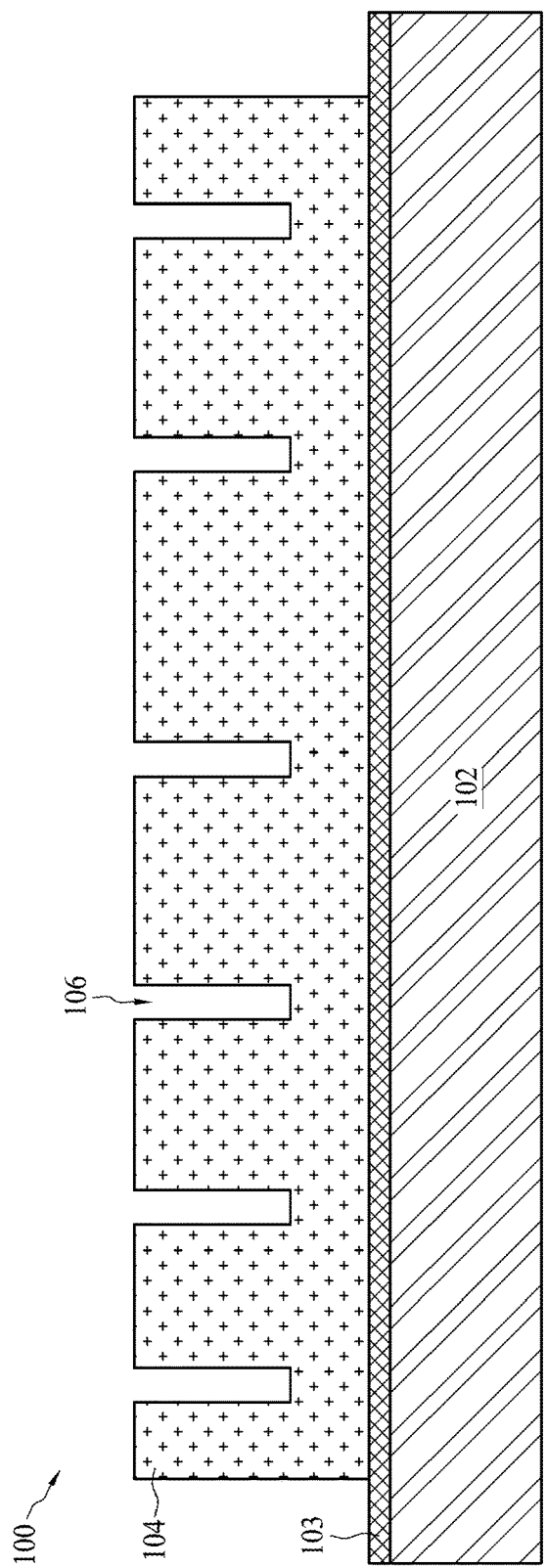

In FIG. 2, openings 106 may be formed in substrate 104. In subsequent processing, a through via may be formed in each opening 106 (see, e.g., FIG. 3). The through vias may provide electrical connections from one side of substrate 104 to an opposite side of substrate 104. Openings 106 may not penetrate through substrate 104, as shown in FIG. 2. When openings 106 do not penetrate through substrate 104, in subsequent processing a thinning step maybe performed on substrate 104 to thin substrate 104 and expose the through vias through substrate 104 (see FIG. 10). In other embodiments openings 106 may penetrate through substrate 104 and a thinning step is not required.

Openings 106 may be formed in any acceptable manner. In some embodiments, a photo resist (not shown) is formed and patterned on substrate 104. The photo resist may be formed by spin coating, or the like, and may be exposed to light for patterning. The pattern of the photo resist corresponds to the pattern of openings 106. The patterning forms openings through the photo resist to expose substrate 104. An etch process may be performed through the photo resist to create openings 106. Any acceptable etching may be used, such as wet etching or dry etching. In some embodiments, the etching may be anisotropic. After the etching is completed, the photo resist may be removed by an acceptable ashing or stripping process, such as by using an oxygen plasma or the like. The resulting structure is depicted in FIG. 2.

Figure 3:
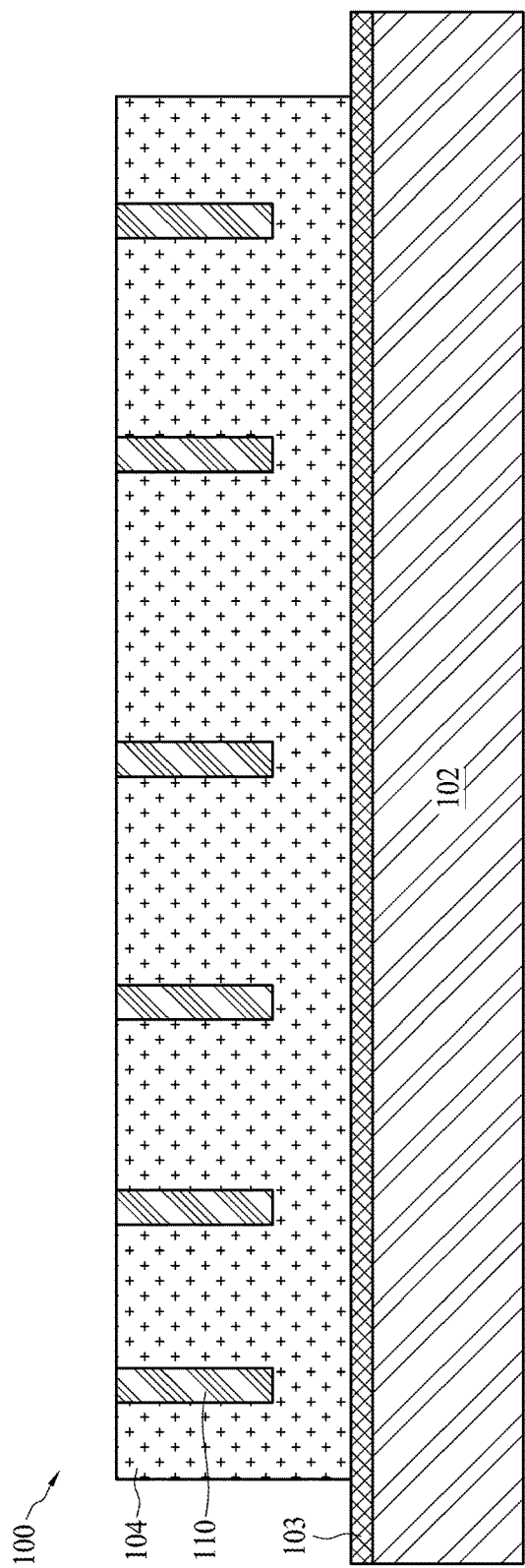

Referring to FIG. 3, openings 106 are filled with a conductive material to form through vias 110. In some embodiments, openings 106 may be filled with conductive material using a plating process, such as electroplating or electroless plating, or the like. The conductive material may comprise a metal, like copper, titanium, tungsten, aluminum, or the like. After filling openings 106 with conductive material to form through vias 110, excess conductive material may overfill openings 106 and extend along an upper surface of substrate 104 (not shown in FIG. 3). A planarization process (such as a grinding process or the like) may be performed to remove the excess portions of conductive material and to make the upper surfaces of through vias 110 substantially planar with the surface of substrate 104. The resulting structure is depicted in FIG. 3.

Figure 4:
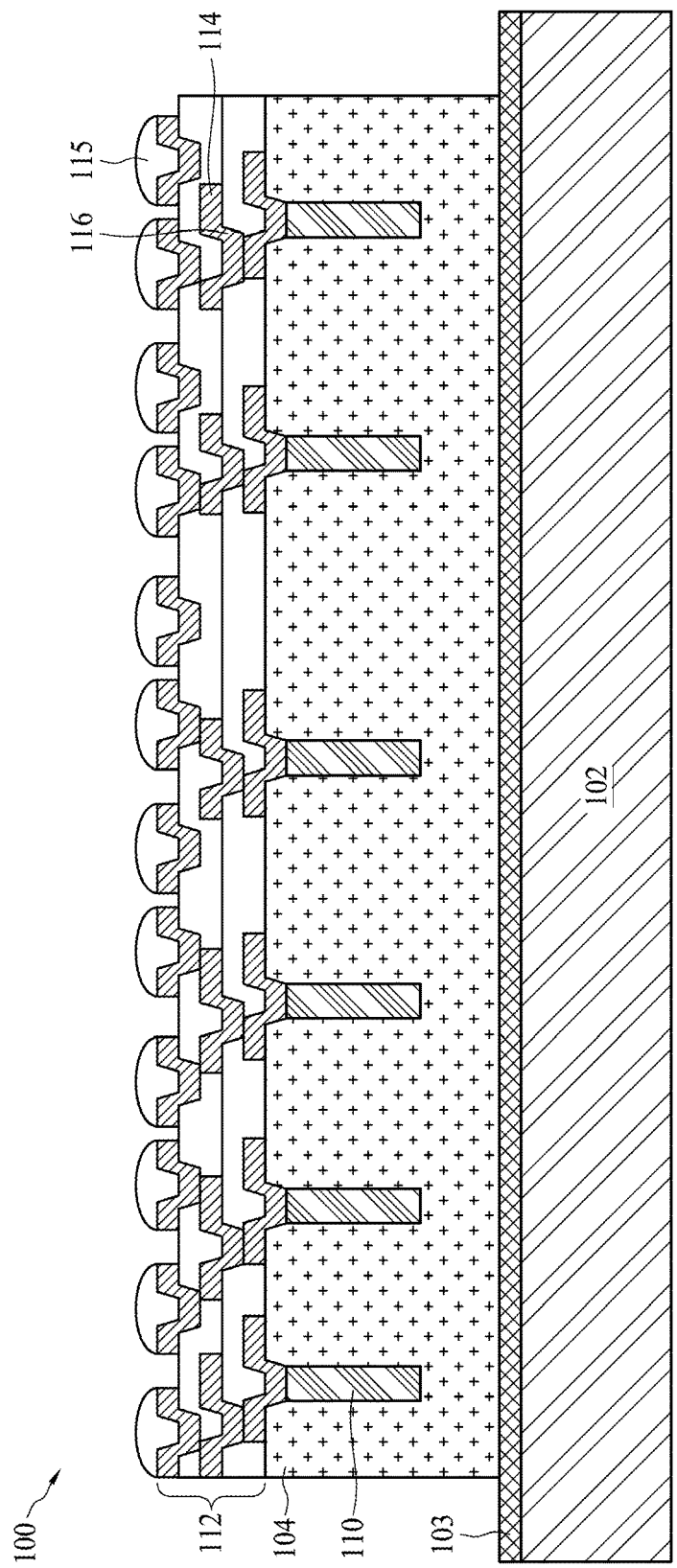

Referring to FIG. 4, one or more layers of redistribution layers (RDLs) 112 are formed over substrate 104. Generally, RDLs 112 provide a conductive pattern that allows a pin-out contact pattern for a completed package different than the pattern of connectors 118C and 120C on dies 118 and 120 that will subsequently be attached to connectors 115 (see FIG. 5A). RDLs 112 comprise conductive lines 114 and vias 116, wherein vias 116 connect an overlying line (e.g., an overlying conductive line 114) to an underlying conductive feature (e.g., through vias 110 and/or conductive lines 114). Conductive lines 114 may extend along any direction according to a particular design.

RDLs 112 may be formed using any suitable process. For example, in some embodiments, a first dielectric layer is formed on substrate 104. In some embodiments, the first dielectric layer is formed of a polymer, which may be a photo-sensitive material such as polybenzoxazole (PBO), polyimide, benzocyclobutene (BCB), or the like, that may be patterned using lithography. In other embodiments, the first dielectric layer is formed of a nitride such as silicon nitride, an oxide such as silicon oxide, PhosphoSilicate Glass (PSG), BoroSilicate Glass (BSG), Boron-doped PhosphoSilicate Glass (BPSG), or the like. The first dielectric layer may be formed by spin coating, lamination, CVD, the like, or a combination thereof. The first dielectric layer is then patterned to form openings to expose through vias 110. In embodiments in which the first dielectric layer is formed of a photo-sensitive material, the patterning may be performed by exposing the first dielectric layer in accordance with a desired pattern and developed to remove the unwanted material, thereby exposing through vias 110. Other methods, such as using a patterned mask and etching, may also be used to pattern the first dielectric layer.

A seed layer (not shown) is formed over the first dielectric layer and in the openings formed in the first dielectric layer. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD, or the like. A mask (not shown) is then formed and patterned on the seed layer in accordance with a desired redistribution pattern. In some embodiments, the mask is a photoresist formed by spin coating or the like and exposed to light for patterning. The patterning forms openings through the mask to expose the seed layer. A conductive material is formed in the openings of the mask and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed, are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form conductive lines 114 and vias 116. A second dielectric layer is then formed over the first dielectric layer to provide a more planar surface for subsequent layers and may be formed using similar materials and processes as used to form the first dielectric layer. In some embodiments, the second dielectric layer is formed of polymer, a nitride, an oxide, or the like. In some embodiments, the second dielectric layer is PBO formed by a spin-on process. The above processes may be repeated as necessary to form a number of RDL layers that may be required for a particular design.

Connectors 115 are formed over RDLs 112 in accordance with some embodiments. Although depicted as bumps in FIG. 4, connectors 115 may be solder balls, metal pillars, controlled collapse chip connection (C4) bumps, micro bumps, electroless nickel-electroless palladium-immersion gold technique (ENEPIG) formed bumps, combination thereof (e.g., a metal pillar having a solder ball attached thereof), or the like. Connectors 115 may include a conductive material such as solder, copper, aluminum, gold, nickel, silver, palladium, tin, the like, or a combination thereof. In some embodiments, connectors 115 comprise a eutectic material and may comprise a solder bump or a solder ball, as examples. The solder material may be, for example, lead-based and lead-free solders, such as Pb—Sn compositions for lead-based solder; lead-free solders including InSb; tin, silver, and copper (SAC) compositions; and other eutectic materials that have a common melting point and form conductive solder connections in electrical applications. For lead-free solder, SAC solders of varying compositions may be used, such as SAC 105 (Sn 98.5%, Ag 1.0%, Cu 0.5%), SAC 305, and SAC 405, as examples. Lead-free connectors such as solder balls may be formed from SnCu compounds as well, without the use of silver (Ag). Alternatively, lead-free solder connectors may include tin and silver, Sn—Ag, without the use of copper. Connectors 115 may form a grid, such as a ball grid array (BGA). In some embodiments, a reflow process may be performed, giving connectors 115 a shape of a partial sphere in some embodiments. Alternatively, connectors 115 may comprise other shapes.

Connectors 115 may also comprise non-spherical conductive connectors, for example. In some embodiments, connectors 115 comprise metal pillars (such as a copper pillar) formed by a sputtering, printing, electro plating, electroless plating, CVD, or the like, with or without a solder material thereon. The metal pillars may be solder free and have substantially vertical sidewalls or tapered sidewalls.

Connectors 115 may also include an under bump metallization (UBM) formed and patterned over an uppermost metallization pattern in accordance with some embodiments, thereby forming an electrical connection with an uppermost metallization layer. The UBMs provides an electrical connection upon which an electrical connector, e.g., a solder ball/bump, a conductive pillar, or the like, may be placed. In an embodiment, the UBMs include a diffusion barrier layer, a seed layer, or a combination thereof. The diffusion barrier layer may include Ti, TiN, Ta, TaN, or combinations thereof. The seed layer may include copper or copper alloys. However, other metals, such as nickel, palladium, silver, gold, aluminum, combinations thereof, and multi-layers thereof, may also be included. In an embodiment, UBMs are formed using sputtering. In other embodiments, electro plating may be used.

Figure 5A:
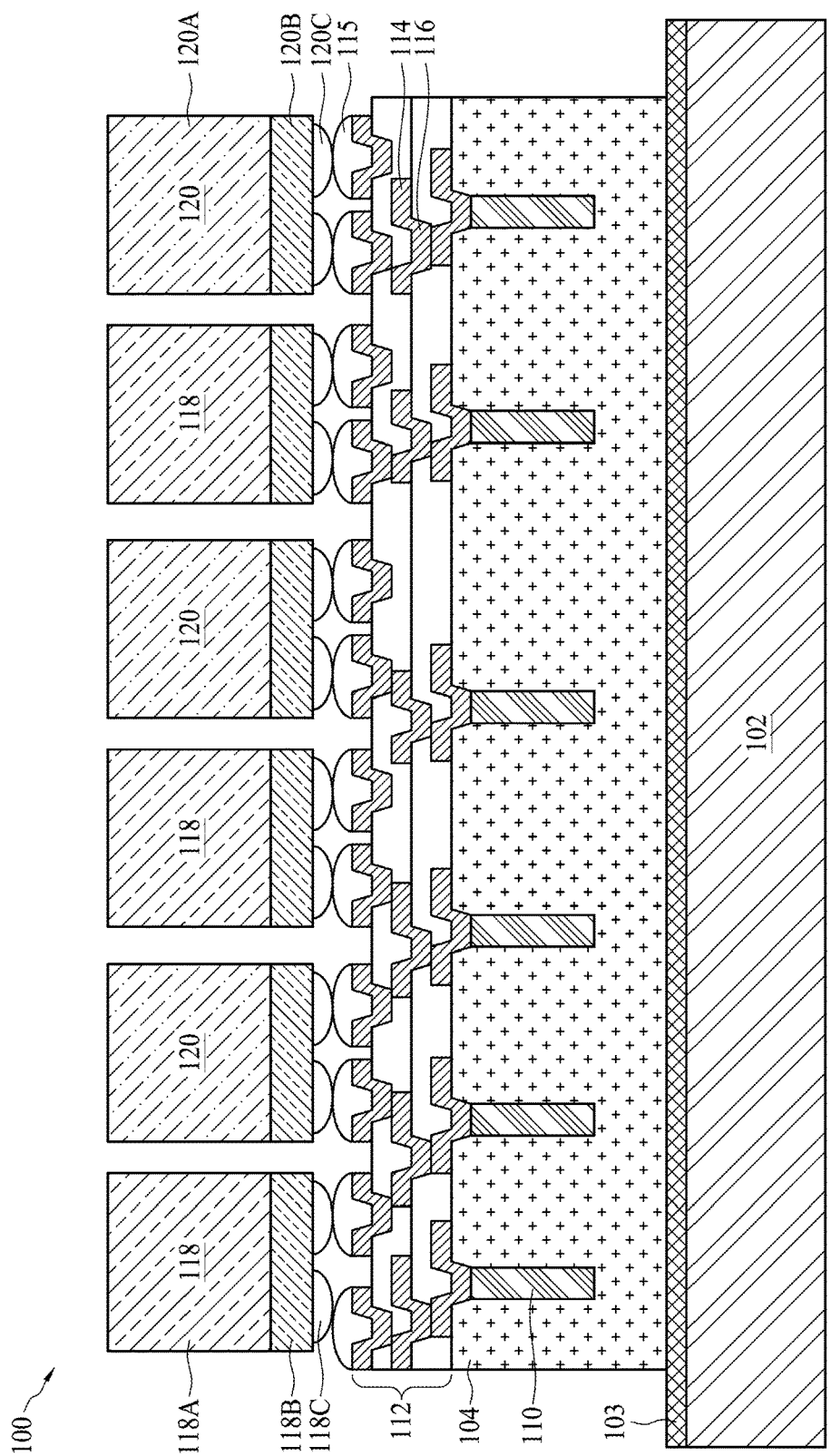

Referring to FIG. 5A, dies 118 and 120 are bonded to connectors 115. In accordance with some exemplary embodiments, dies 118 are logic dies, such as Central Processing Units (CPUs), Application processors (APs), system on chips (SOCs), Application Specific Integrated Circuits (ASICs), or other types of logic dies including logic transistors therein. Although three dies 118 are illustrated, fewer or more dies 118 may be bonded to connectors 115. Dies 118 may have an identical structure and/or identical functions, or may have different structures and functions.

According to some embodiments, dies 118 may each include a main body 118A, an interconnect region 118B, and connectors 118C. Main body 118A may comprise any number of dies, substrates, transistors, active devices, passive devices, or the like. Interconnect region 118B may provide a conductive pattern that allows a pin-out contact pattern for main body 118A that is different than the pattern of connectors 118C, allowing for greater flexibility in the placement of connectors 118C. Connectors 118C may be disposed on a bottom side of dies 118, and may be used to physically and electrically connect dies 118 to connectors 115. Connectors 118C may be electrically connected to main body 118A by interconnect region 118B. Connectors 118C may be formed using methods that are the same or similar to the methods described above in connection with connectors 115.

Dies 120, in accordance with some exemplary embodiments, comprise memory dies. For example, dies 120 may be Dynamic Random Access Memory (DRAM) dies, Static Random Access Memory (SRAM) dies, High-Bandwidth Memory (HBM) dies, Micro-Electro-Mechanical System (MEMS) dies, Hybrid Memory Cube (HMC) dies, or the like. Although three dies 120 are illustrated, fewer or more dies 120 may be bonded. Dies 120 may have an identical structure and/or function, or may have different structures and functions. According to some embodiments, dies 120 may include a main body 120A, an interconnect region 120B, and connectors 120C.

Figure 5B:
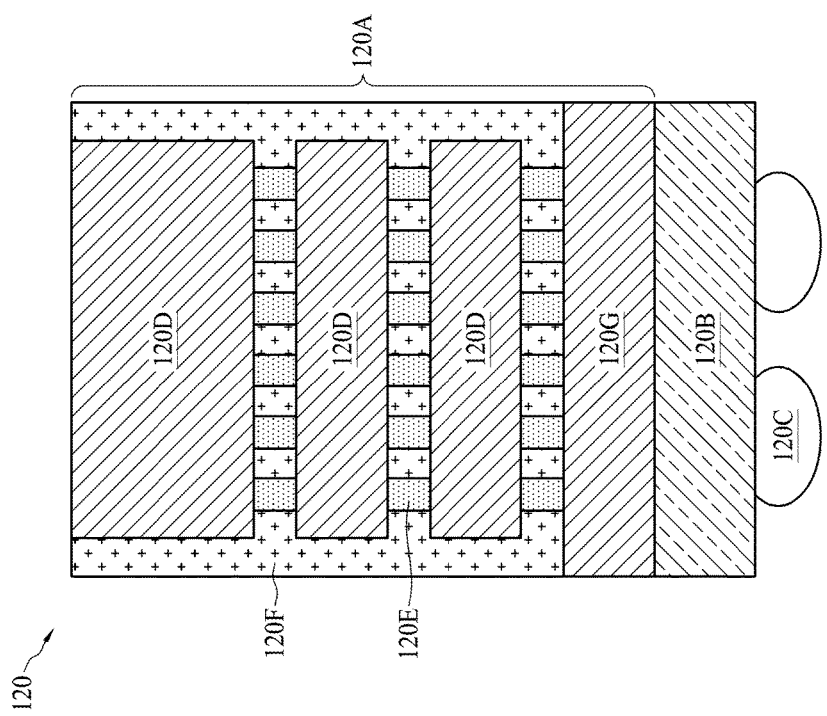

An exemplary die 120, in accordance with some embodiments, is depicted in greater detail in FIG. 5B. Main body 120A may comprise a plurality of stacked memory dies 120D. Stacked memory dies 120D may all be identical dies, or memory dies 120D may include dies of different types and/or structures. A memory die 120D may be connected to an overlying die 120D and/or an underlying memory die 120D by a connector 120E. In some embodiments, main body 120A may include HBM (high bandwidth memory) and/or HMC (high memory cube) modules, which may include one or more memory dies 120D connected to a logic die 120G. Logic die 102G may comprise through vias (not shown) that connect a conductive feature of interconnection region 120B to an overlying connector 120E. As illustrated by FIG. 5B, main body 120A may be encapsulated in a molding material 120F. Molding material 120F may include a molding compound, a molding underfill, an epoxy, or a resin.

Interconnection region 120B underlies main body 120A. Interconnection region 120B may provide a conductive pattern that allows a pin-out contact pattern for main body 120A that is different than the pattern of connectors 120C, allowing for greater flexibility in the placement of connectors 120C. Connectors 120C may be disposed on a bottom side of dies 120, and may be used to physically and electrically connect dies 120 to connectors 115. Connectors 120C may be electrically connected to logic die 120G and/or stacked memory dies 120D by interconnection region 120B. Connectors 120C may be formed using methods that are the same or similar to the methods described above in connection with connectors 115.

FIG. 5A depicts embodiments in which dies 118 and 120 are interleaved in a plan view. In some embodiments, a different arrangement of dies 118 and 120 may be used. For example, in some embodiments a die 118 may include a die 120 on either side of the die 118.

Dies 118 and 120 may be bonded to connectors 115 using any suitable method. According to some embodiments, dies 118 and 120 may respectively be bonded to connectors 115 by bonding connectors 118C and 120C to connectors 115.

Figure 6:
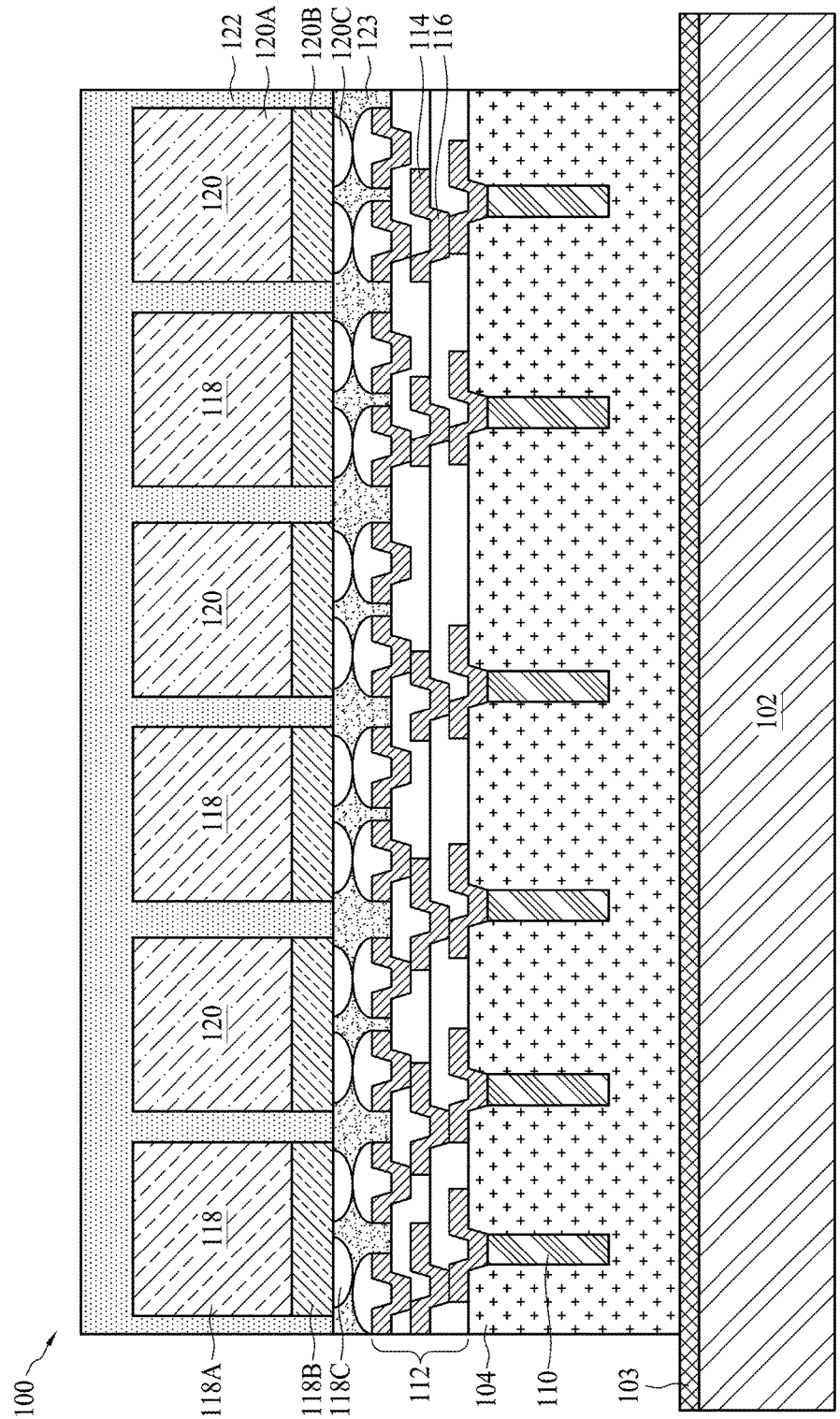

Referring to FIG. 6, underfill 123 may be formed between dies 118/120 and RDLs 112 and may surround connectors 115, 118C, and/or 120C. Underfill 123 may be formed by a capillary flow process after dies 118 and 120 are attached, or may be formed by a suitable deposition method before dies 118 and 120 are attached.

Next, dies 118 and 120 are encapsulated in molding material 122. Molding material 122 fills the gaps between dies 118 and dies 120, and may be in contact with connectors 115, connectors 118C, connectors 120C, and/or RDLs 112. Molding material 122 may include a molding compound, a molding underfill, an epoxy, or a resin. Molding material 122 may be a same material as molding material 120F of dies 120, or may be a different material. After forming, the top surface of molding material 122 may be higher than the top surfaces of dies 118 and 120.

Figure 7:
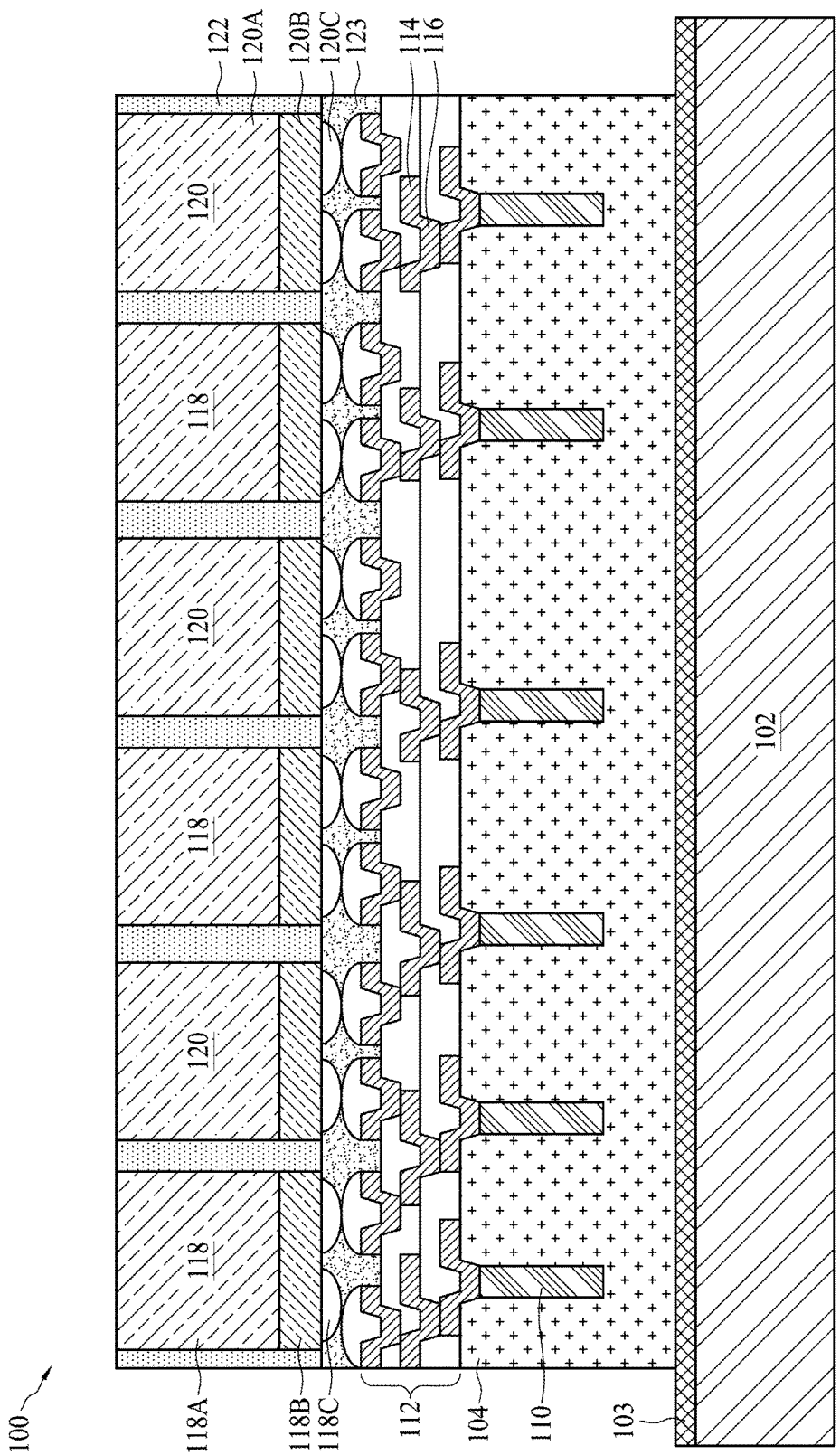

Next, a grinding step is performed to thin molding material 122, until top surfaces of dies 118 and dies 120 are exposed. The resulting structure is shown in FIG. 7.

Figure 8:
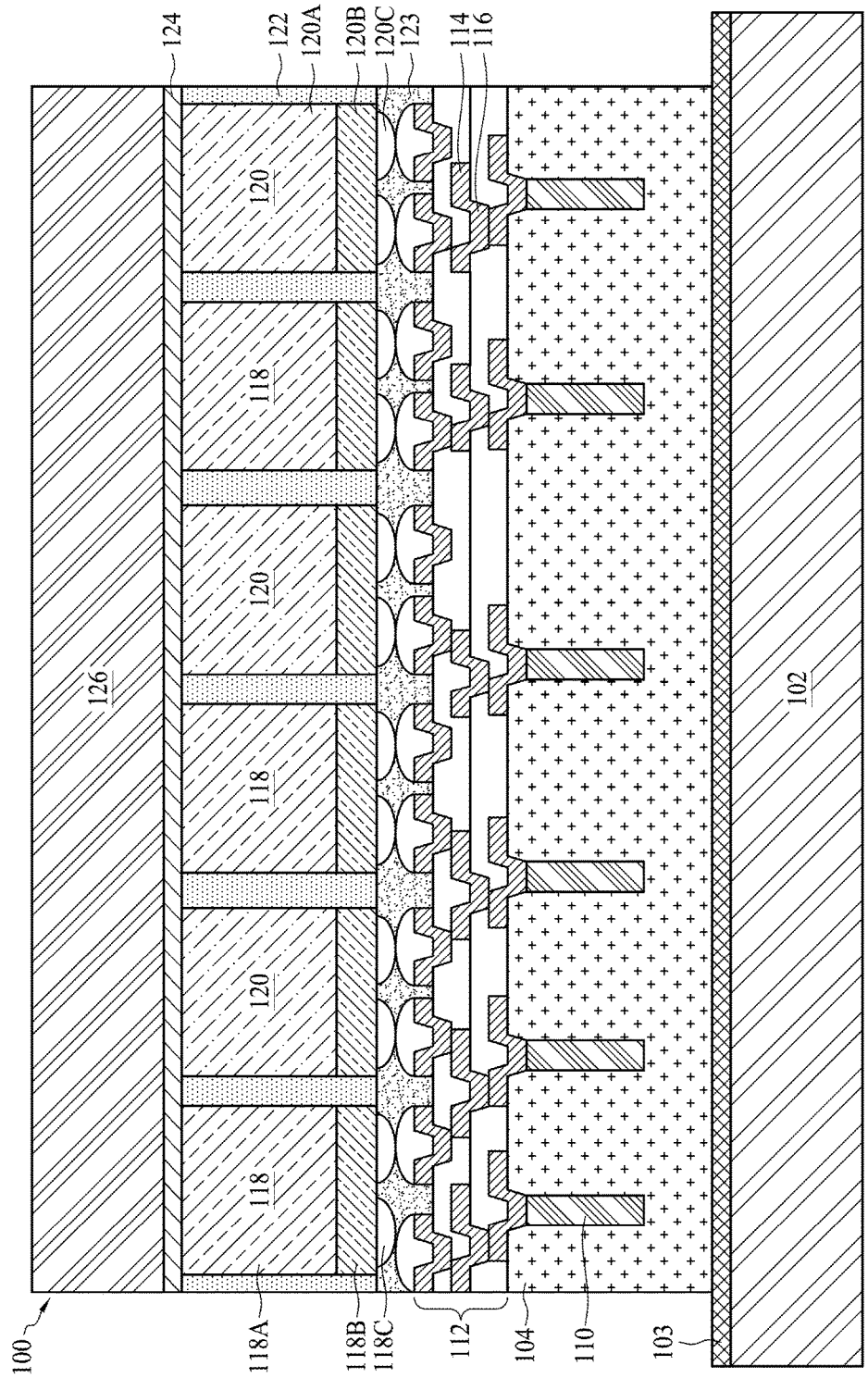

Referring to FIG. 8, substrate 126 is attached to the surfaces of dies 118 and 120 that are exposed through molding material 122. Substrate 126 may be attached using an adhesive layer 124. In some embodiments, adhesive layer 124 may comprise a die attach film (DAF).

Substrate 126 may provide structural support to package 100 during subsequent processing. For example, as described above, top surfaces of dies 118 and dies 120 are exposed through molding material 122, which may result in extrinsic stress on package 100 and which may result in damage to the top surfaces of the package 100 during processing (for example during testing or on-board processing). Substrate 126 may help to reduce damage to the top surfaces of package 100 during subsequent processing. Substrate 126 may also help to reduce warpage of package 100 during subsequent processing, thereby increasing reliability of package 100. Further, as will be described below, in subsequent processing package 100 will be flipped, and substrate 126 may provide physical support to package 100 during additional processing of package 100. The presence of substrate 126 may eliminate the need for a separate carrier (e.g., a glass carrier) and debond process, which may help to reduce manufacturing costs.

In some exemplary embodiments, substrate 126 may be formed of silicon. For example, substrate 126 may be formed of substantially pure silicon. In other embodiments, substrate 126 may comprise any suitable material that provides rigidity and/or thermal conductance, such that substrate 126 may help to evenly distribute heat from package 100 and provide structural support to the top surfaces of dies 118 and 120 during additional processing. In some embodiments, substrate 126 may comprise a metal, such as Cu, Ni, or Al. In some embodiments, substrate 126 may comprise a ceramic material. For example, substrate 126 may comprise $Al_2O_3$ in some embodiments. In some embodiments, substrate 126 may comprise a polymer material.

Figure 9:
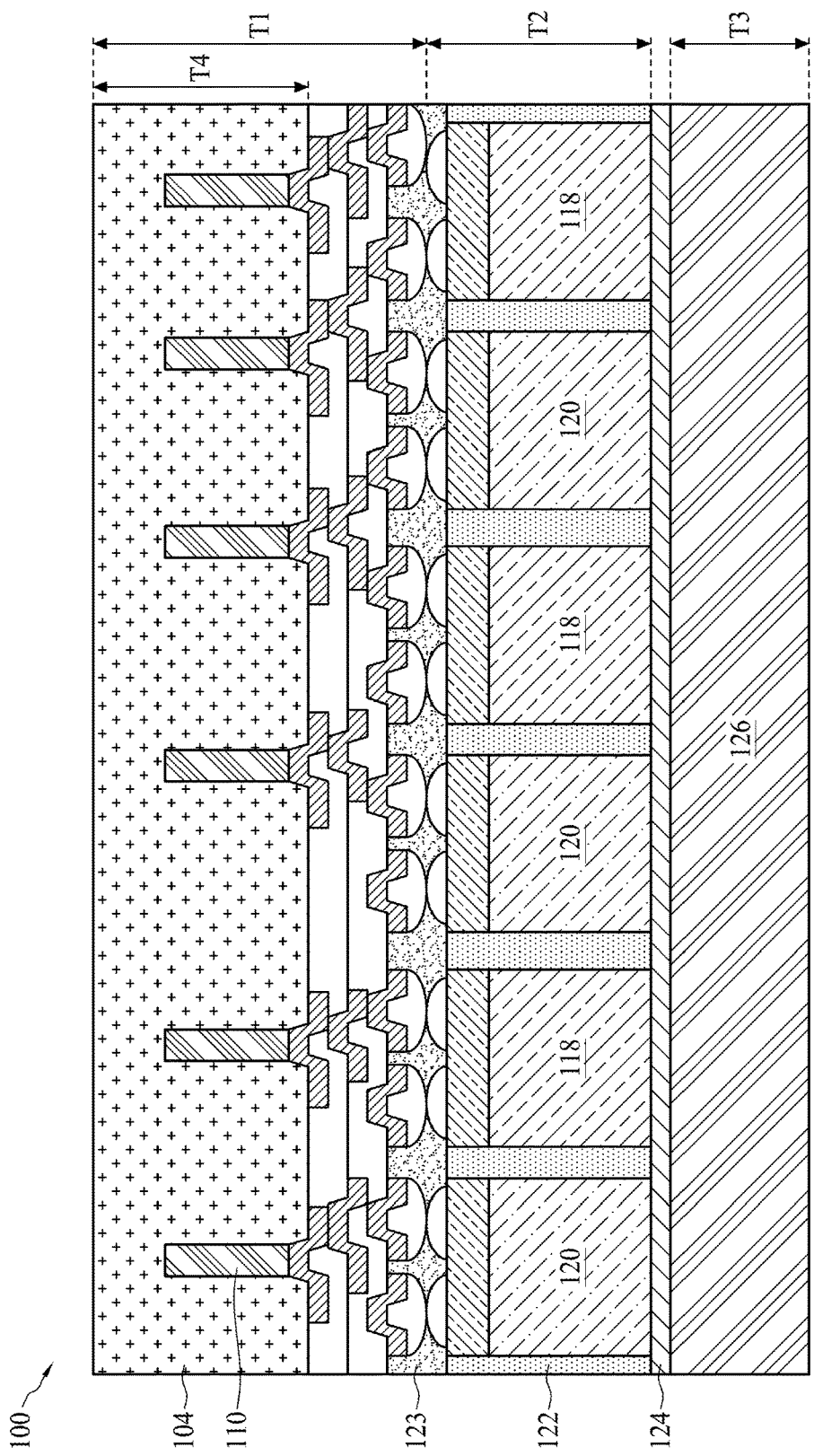

Referring to FIG. 9, package 100 is flipped so that substrate 126 is on the bottom and provides physical support for package 100. Carrier 102 is debonded, leaving the structure shown in FIG. 9. As depicted in FIG. 9, at this stage of processing, substrate 104, RDLs 112 and connectors 115 have a combined thickness T1 of about 10 µm to about 1000 µm, such as about 775 µm. Dies 118 and dies 120 each have a thickness T2 of about 50 µm to about 1000 µm, such as 760 µm. Substrate 126 has a thickness T3 of about 10 µm to about 1000 µm, such as about 775 µm. Substrate 104 has a thickness T4 of about 10 µm to about 1000 µm, such as about 775 µm.

Figure 10:
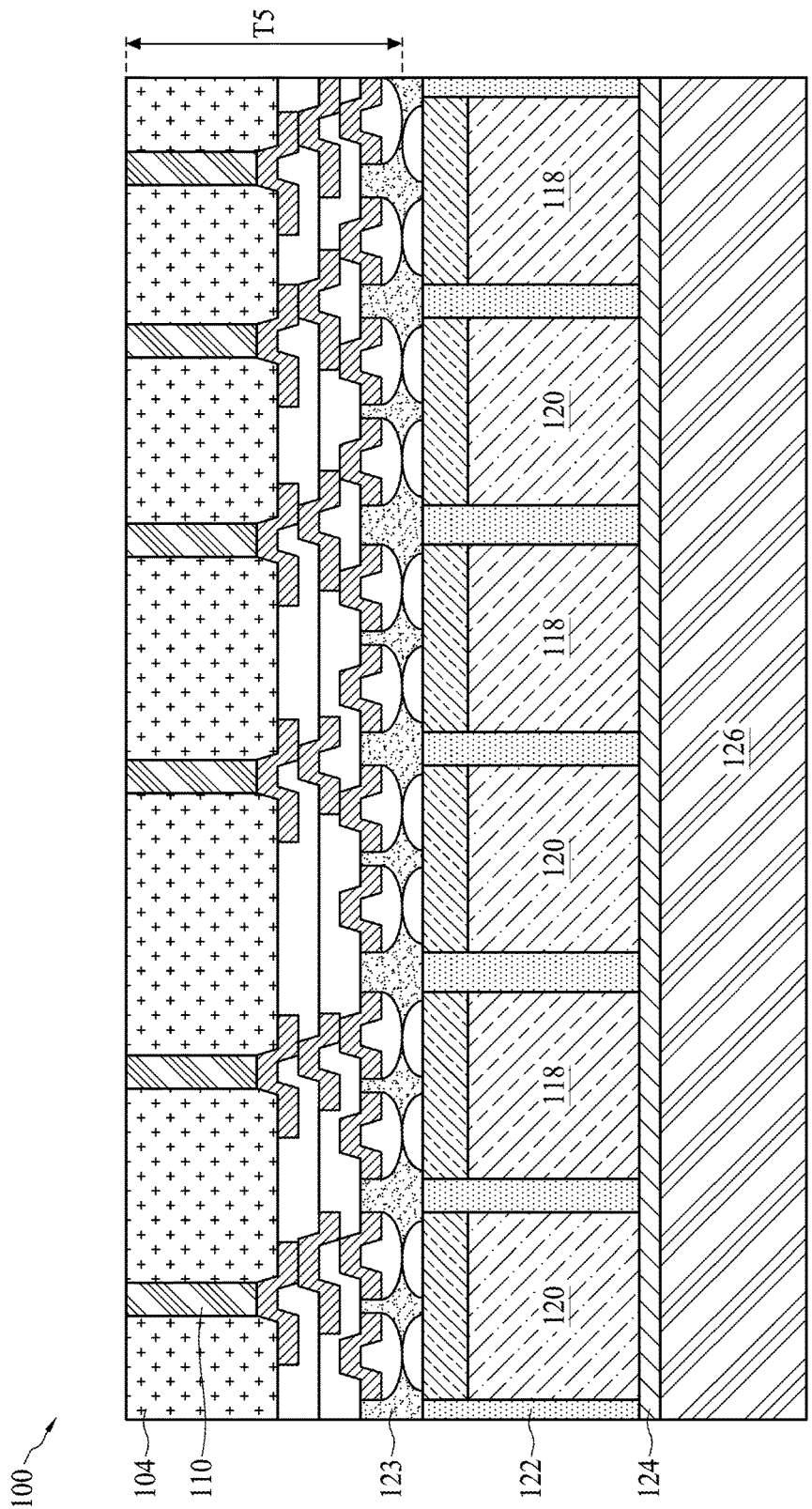

Next, referring to FIG. 10, substrate 104 is thinned until through vias 110 are exposed. For example, substrate 104 may be thinned using a grinding process. After the thinning, substrate 104, RDLs 112 and connectors 115 may have a combined thickness T5 of about 5 µm to about 1000 µm, such as 100 µm. The thinning process may create metal residues such as metal particles on the top surfaces. Accordingly, after the thinning, a cleaning may be performed, for example, through a wet etching, so that the metal residue is removed.

Figure 11:
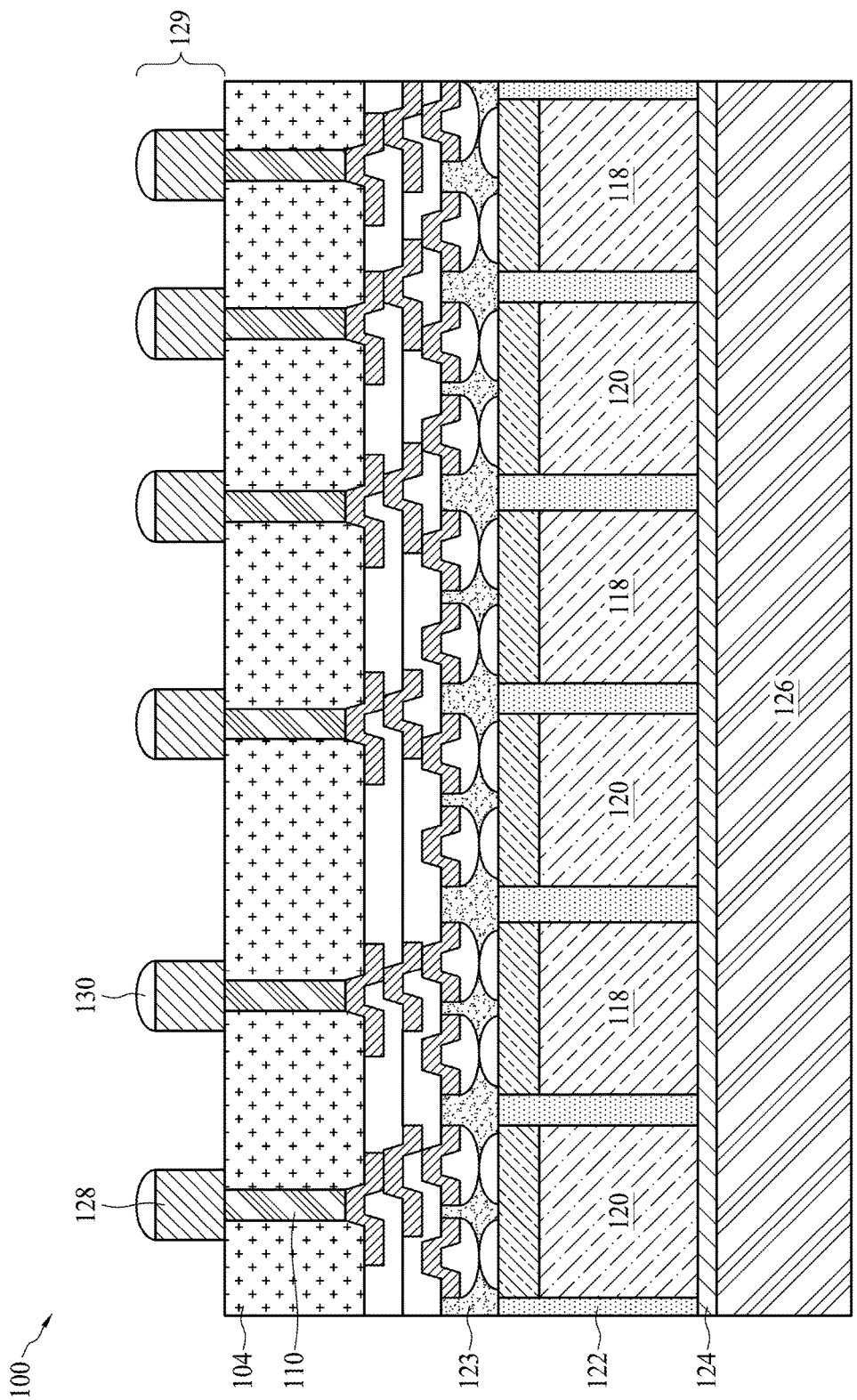

Referring to FIG. 11, connectors 129 are formed on substrate 104 using the same or similar methods described above in connection with connectors 115. In the embodiment depicted in FIG. 11, each connector 129 comprises a metal pillar 128 (such as a copper pillar) formed by a sputtering, printing, electro plating, electroless plating, CVD, or the like. Each metal pillar 128 has solder 130 formed on a surface that is opposite to the surface that contacts substrate 104. Metal pillars 128 may have substantially vertical sidewalls, such as the embodiment depicted in FIG. 11, or may have tapered sidewalls in other embodiments.

Figure 12:
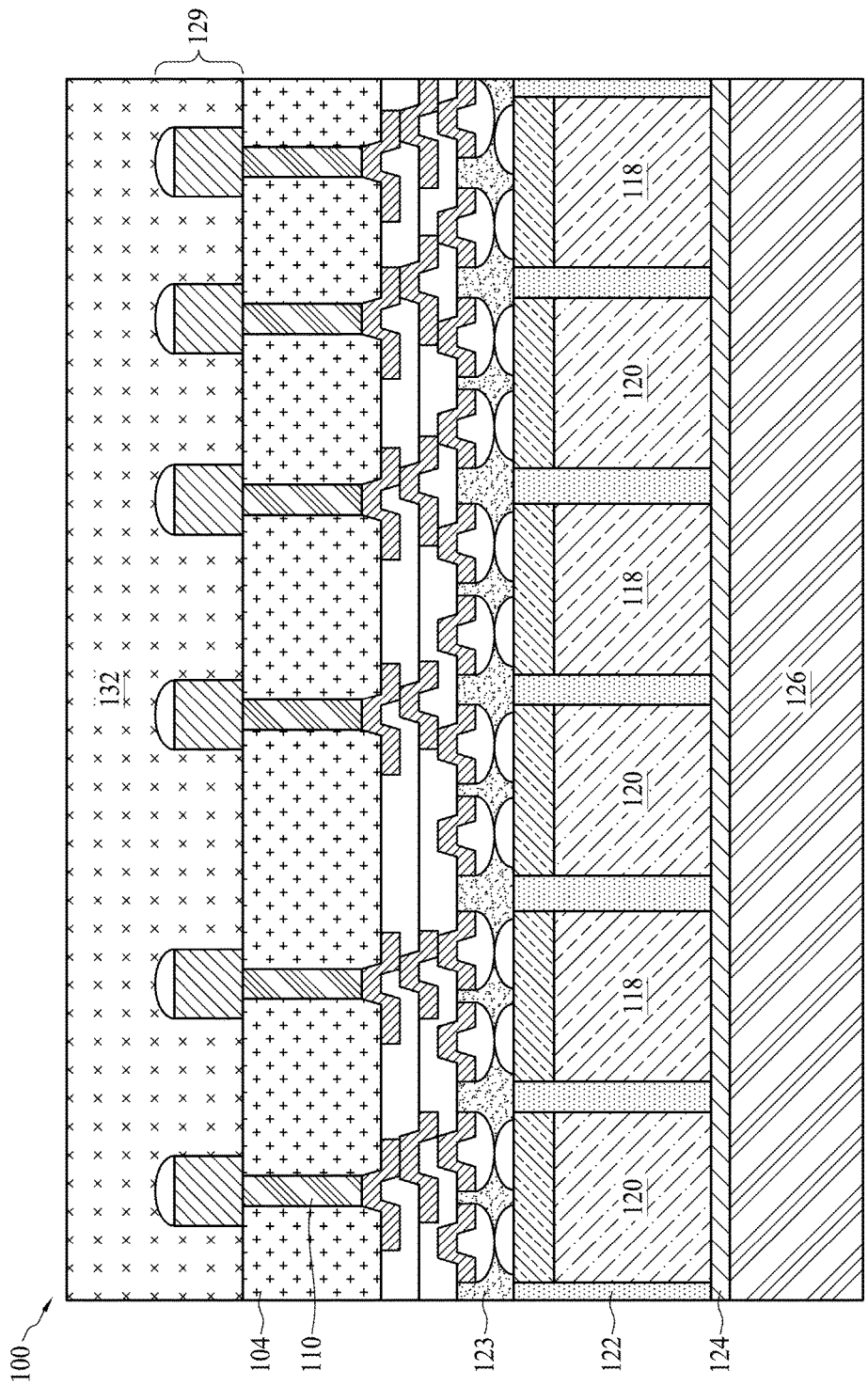

Next, protection film 132 is applied over substrate 104, as illustrated in FIG. 12. Protection film 132 extends along sidewalls of connectors 129, and has a sufficient thickness to fully cover connectors 129. Protection film 132 may be a tape, such as a backgrinding (BG) tape (UV or non-UV type), which may be used to protect the surface of substrate 104 and connectors 129 from grinding debris during a subsequent planarization process (see FIGS. 13-14). Protective film 132 may be applied using, for example, a roller (not shown).

Figure 13:
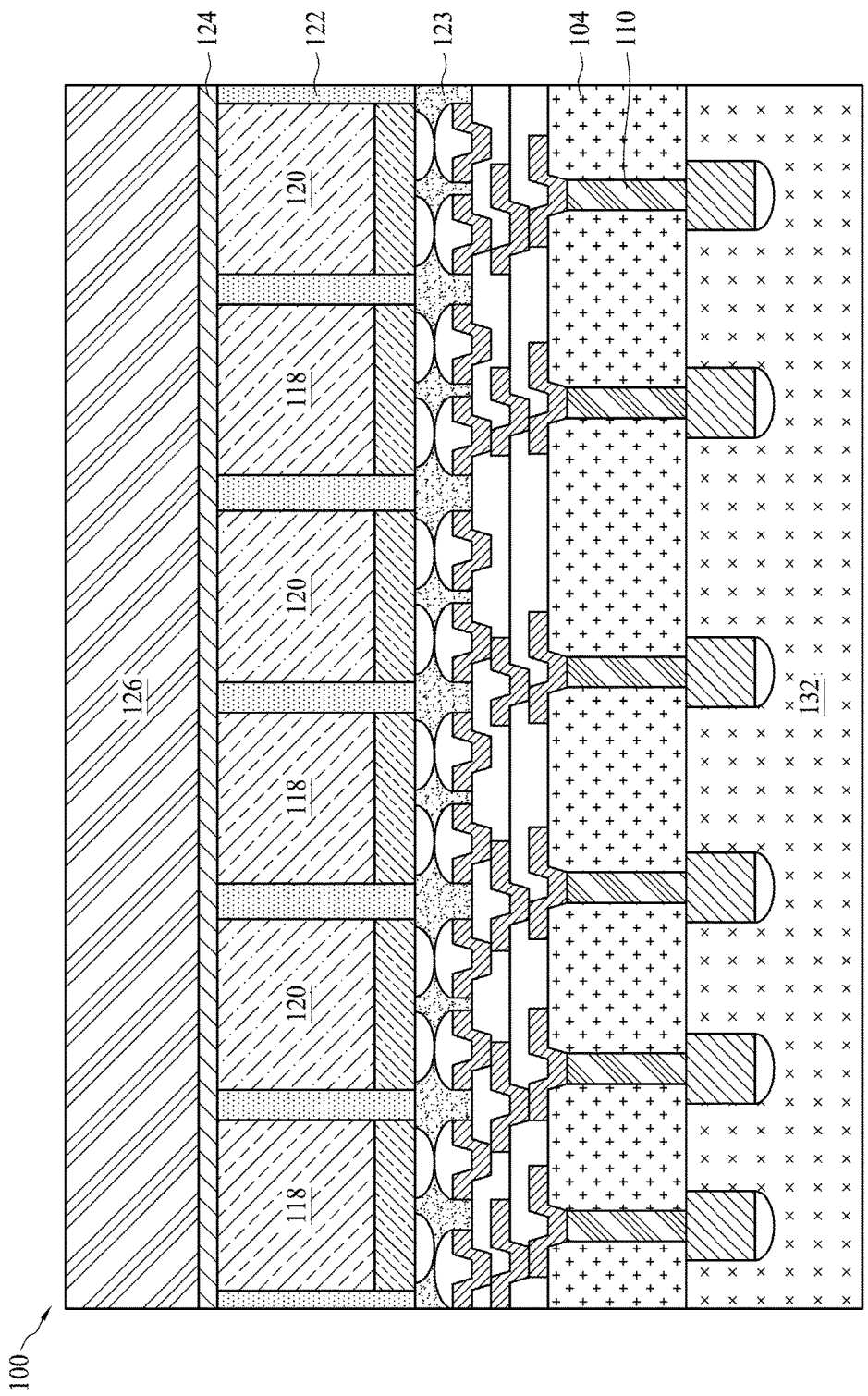

Referring to FIG. 13, package 100 is flipped again so that protective film 132 is on the bottom and provides physical support to package 100. After the flipping, substrate 126 is on top of package 100.

Figure 14:
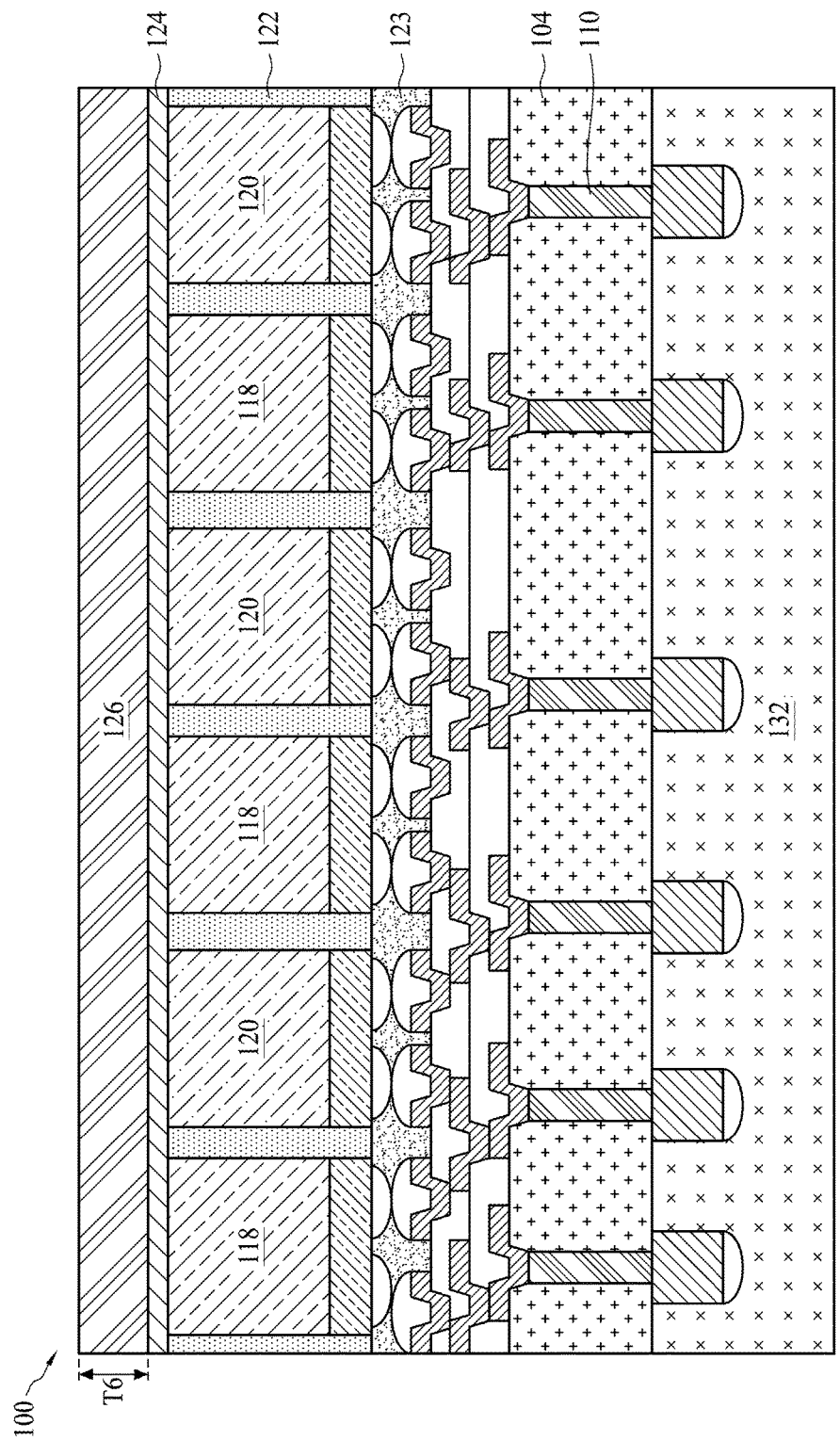

Next, referring to FIG. 14, substrate 126 is thinned. In some embodiments, substrate 126 may be thinned using a grinding process. After the thinning, substrate 126 may have a thickness T6 of about 5 µm to about 1000 µm, such as 50 µm. The thinning process may create metal residues such as metal particles on the top surface of substrate 126. Accordingly, after the thinning, a cleaning may be performed, for example, through a wet etching, so that the metal residue is removed.

Figure 15:
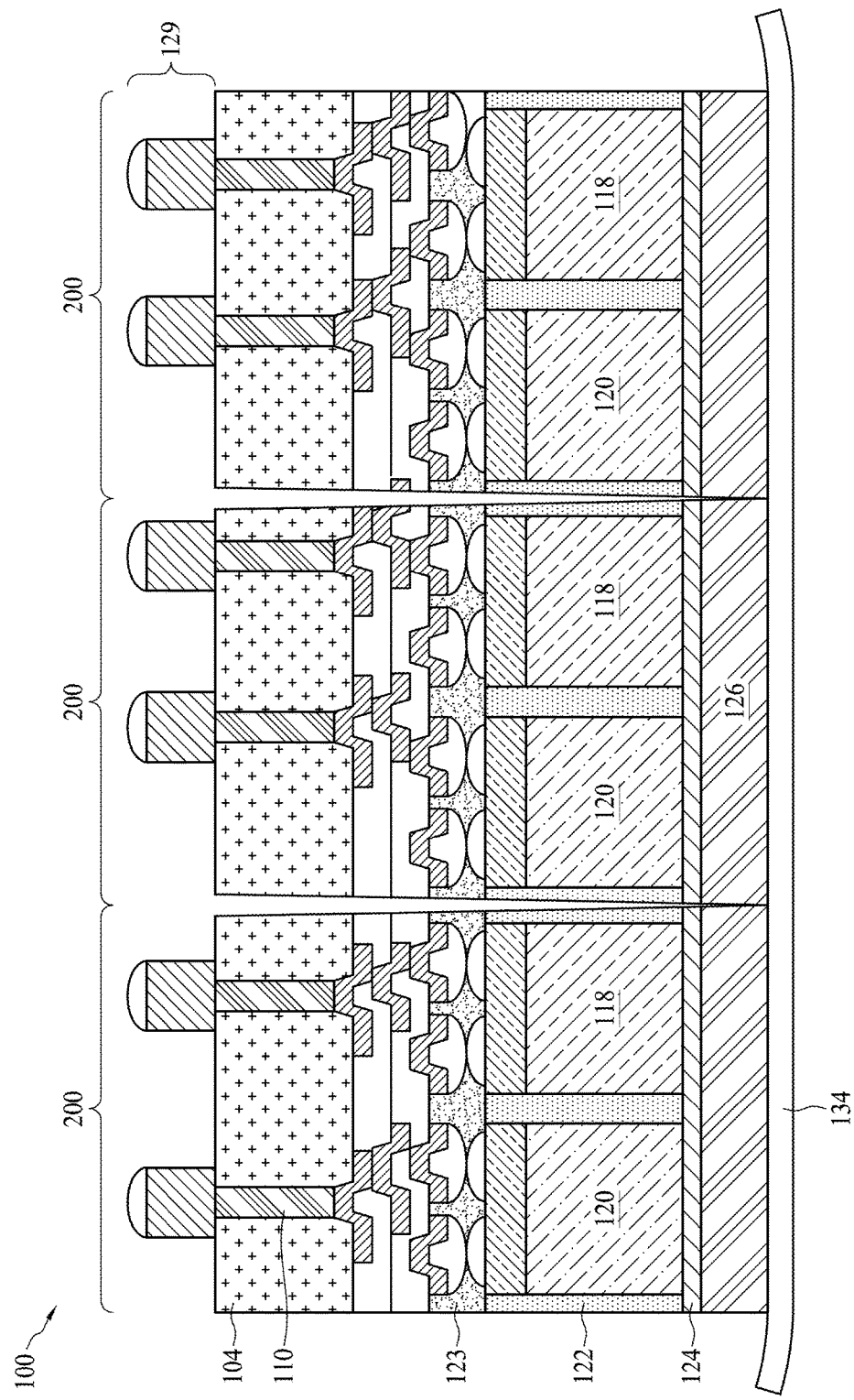

Referring to FIG. 15, package 100 is flipped again, and substrate 126 may be attached to a temporary support frame 134 (e.g., comprising a support tape). Next, protective film 132 is removed, exposing connectors 129. Next, package 100 is singulated into individual packages 200. In some embodiments, package 100 may be singulated by sawing or the like. Package 100 may be singulated so that each individual package 200 comprises a die 118 and a die 120. In other embodiments, different numbers and/or configurations of dies 118 and 120 may be used for each package 200.

Figure 16A:
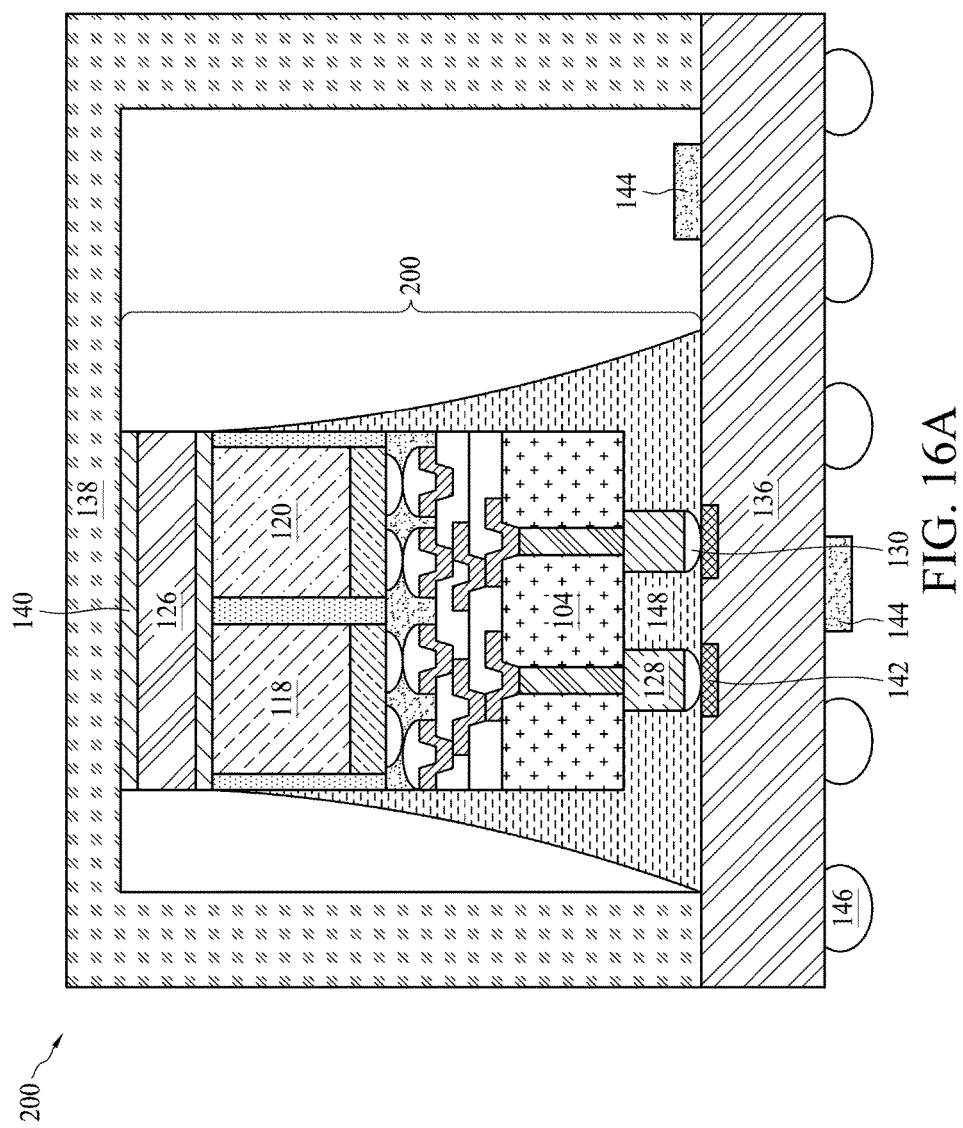
FIGS. 16A and 16B are cross sectional views of semiconductor package structures in accordance with some embodiments.

Next, referring to FIG. 16A, a package 200 is flipped and bonded to substrate 136. Substrate 136 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 136 may be a SOI substrate. Generally, an SOI substrate includes a layer of a semiconductor material such as epitaxial silicon, germanium, silicon germanium, SOI, silicon germanium on insulator (SGOI), or combinations thereof. Substrate 136 is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for substrate 136.

Figure 16B:
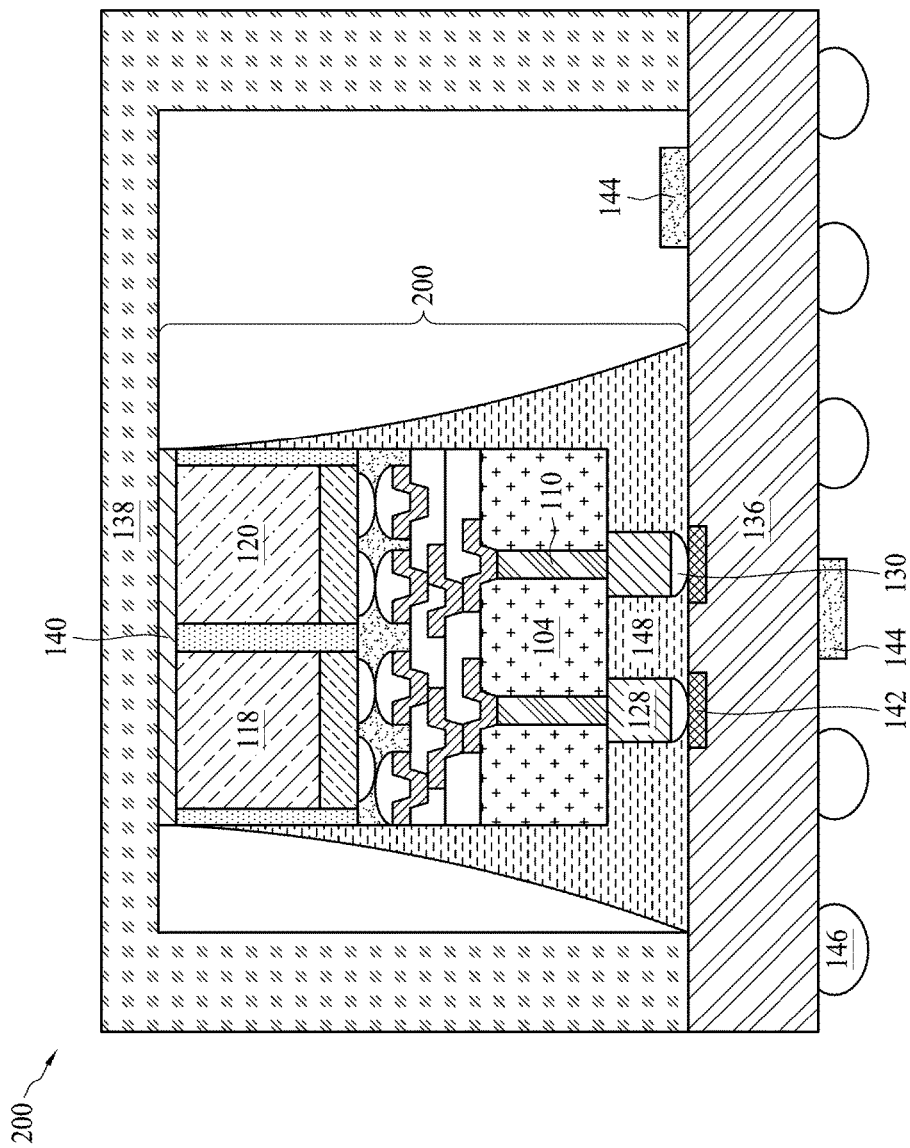

Substrate 136 may include active and passive devices (not shown in FIG. 16B). As one of ordinary skill in the art will recognize, a wide variety of devices such as transistors, capacitors, resistors, combinations of these, and the like may be used to generate the structural and functional requirements of the design for the semiconductor package. The devices may be formed using any suitable methods.

Substrate 136 may also include metallization layers and vias (not shown) and bond pads 142 connected to the metallization layers and vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, substrate 136 is substantially free of active and passive devices.

Substrate 136 may include connectors 146 on a bottom surface of substrate 136. Connectors 146 may be used to physically and electrically connect substrate 136 to other devices, packages, components, and the like. Additionally, one or more surface devices 144 may be connected to substrate 136. Surface devices 144 may be used to provide additional functionality or programming to package 200, or the package as a whole. In an embodiment surface devices 144 may include surface mount devices (SMDs) or an integrated passive devices (IPDs) that comprise passive devices such as resistors, inductors, capacitors, jumpers, combinations of these, or the like that are desired to be connected to and utilized in conjunction with package 200, or other parts of the package. Surface devices 144 may be placed on a first major surface of substrate 136, an opposing major surface of substrate 136, or both, according to a particular approach.

Package 200 may be bonded to substrate 136 using bond pads 142. Bond pads 142 may be formed using any suitable methods, such as the methods described above in connection with connectors 115. Bond pads 142 may have top surfaces that are level with substrate 136. In other embodiments, bond pads 142 protrude from substrate 136. Bond pads 142 may be used to connect to pillars 128 and/or solder 130, thereby bonding package 200 to substrate 136.

In some embodiments, underfill 148 may be formed on a surface of substrate 136 proximate to connectors 129 (metal pillars 128 and solder 130 in FIG. 16A). In some embodiments, underfill 148 extends along sidewalls of pillars 128 and along a bottom surface of substrate 104. In some embodiments underfill 148 further extends along sidewalls of substrate 104, RDLs 112, and/or dies 118 and 120. Underfill 148 may be formed by a capillary flow process after package 200 is attached to substrate 136 or may be formed by a suitable deposition method before package 200 is attached to substrate 136.

Next, thermal interface material 140 is applied to a top surface of substrate 126. Thermal interface material 140 may help to dissipate heat from package 200 to a heat dissipation lid 138 which is subsequently applied, thereby helping to maintain a lower temperature in the package structure. Thermal interface material 140 may comprise any suitable thermally conductive material, for example, a polymer having a good thermal conductivity, which may be between about 3 watts per meter kelvin (W/m·K) to about 5 W/m·K or more.

Next, heat dissipation lid 138 is attached. Heat dissipation lid 138 may provide physical protection to the package structure in addition to dissipating heat. Heat dissipation lid 138 may have a high thermal conductivity, for example, between about 200 W/m·K to about 400 W/m·K or more, and may be formed using a metal, a metal alloy, graphene, carbon nanotubes (CNT), and the like. Heat dissipation lid 138 is attached to substrate 136, in some embodiments using adhesive or the like, so that package 200 is arranged within an inner cavity of heat dissipation lid 138. In some embodiments, one or more surface devices 144 may be disposed within the inner cavity of heat dissipation lid 138. In some embodiments, one or more surface devices may be disposed on substrate 136 outside a perimeter of heat dissipation lid 138.

Other embodiments are possible. Referring to FIG. 16A, an embodiment is depicted in which substrate 126 has been removed before heat dissipation lid 138 is applied. For example, after bonding package 200 to substrate 16B using the same or similar methods discussed above in connection with FIG. 16A, and before attaching heat dissipation lid 138, in some embodiments, substrate 126 is removed. Thermal interface material 140 is optionally applied on the surface of dies 118 and 120 from which substrate 126 was removed.

Next, heat dissipation lid 138 is applied using the same or similar methods discussed above in connection with FIG. 16A.

As discussed herein, in accordance with some embodiments a chip on wafer on substrate (COWOS) package is provided. A substrate may be attached to backsides of dies in the COWOS package. The substrate may protect the dies and may reduce package warpage during manufacture. As such, reliability of the packages may be improved. The substrate may be used to provide temporary physical support for the package during manufacture, thereby reducing the need for a separate carrier and carrier debond process, which may help to reduce manufacturing costs.

A method is provided in accordance with some embodiments. The method includes attaching a first die and a second die to an interposer. The method also includes attaching a first substrate to a first surface of the first die and a first surface of the second die. The first substrate includes silicon. The first surface of the first die is opposite to the surface of the first die that is attached to the interposer, and the first surface of the second die is opposite to the surface of the second die that is attached to the interposer. The method also includes bonding the interposer to a second substrate.

A method is provided in accordance with some embodiments. The method includes forming a plurality of through vias in a first substrate. The method also includes attaching a plurality of first dies and a plurality of second dies to the first substrate, and coupling the plurality of first dies and the plurality of second dies to the plurality of through vias. The method also includes encapsulating the plurality of first dies and the plurality of second dies in a molding material, where top surfaces of the plurality of first dies and the plurality of second dies are exposed through the molding material. The method also includes attaching a second substrate to the top surfaces of the plurality of first dies and the plurality of second dies that are exposed through the molding material. The method also includes bonding the first substrate to a third substrate.

A device is provided in accordance with some embodiments. The device includes a first substrate and an interposer bonded to the first substrate. A first die and a second die are bonded to the interposer. A molding material extends along sidewalls of the first die and the second die, where top surfaces of the first die and the second die are exposed through the molding material. A second substrate is attached to the top surfaces of the first die and the second die that are exposed through the molding material. The second substrate includes silicon.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
attaching a first die and a second die to an interposer;
attaching a first substrate to a first surface of the first die and a first surface of the second die, the first substrate comprising silicon, the first surface of the first die being opposite to a second surface of the first die that is attached to the interposer, and the first surface of the second die being opposite to a second surface of the second die that is attached to the interposer;

forming a plurality of electrical connectors over the interposer, each electrical connector of the plurality of electrical connectors being electrically connected to a respective through via of a plurality of through vias comprised in the interposer, wherein the first substrate physically supports the interposer during the forming of the plurality of electrical connectors;

bonding the interposer to a second substrate using the plurality of electrical connectors; and attaching a heat dissipation lid to the second substrate, the interposer being disposed in an inner cavity of the heat dissipation lid.

2. The method according to claim 1, further comprising:
applying a thermal interface material to a surface of the first substrate; and
wherein the first substrate is disposed in an inner cavity of the heat dissipation lid.

3. The method according to claim 2, further comprising bonding a surface mounted device (SMD) to the second substrate, wherein the SMD is in the inner cavity of the heat dissipation lid after the heat dissipation lid is attached to the second substrate.

4. The method according to claim 1, wherein the first die is a logic die and the second die is a memory die.

5. The method according to claim 1, wherein the first substrate is bonded to the first surface of the first die and the first surface of the second die using a die attach film.

6. The method according to claim 1, further comprising:
thinning the interposer;
wherein the first substrate underlies the interposer and provides physical support to the interposer during the thinning.

7. The method according to claim 6, wherein the thinning exposes the plurality of through vias comprised in the interposer.

8. The method according to claim 1, further comprising thinning the first substrate.

9. The method according to claim 8, wherein the first die comprises a first memory die and a second memory die, the first memory die being connected to the second memory die by a connector.

10. The method according to claim 1, further comprising removing the first substrate before bonding the interposer to the second substrate.

11. A method, comprising:
forming a plurality of through vias in a first substrate;
attaching a plurality of first dies and a plurality of second dies to the first substrate, and coupling the plurality of first dies and the plurality of second dies to the plurality of through vias;
encapsulating the plurality of first dies and the plurality of second dies in a molding material, wherein top surfaces of the plurality of first dies and the plurality of second dies are exposed through the molding material;

attaching a second substrate to the top surfaces of the plurality of first dies and the plurality of second dies that are exposed through the molding material;
thinning the second substrate after attaching the second substrate to the top surfaces of the plurality of first dies and the plurality of second dies; and
bonding the first substrate to a third substrate.

12. The method of claim 11, further comprising attaching a lid to the third substrate, a first die of the plurality of first dies and a second die of the plurality of second dies being disposed in a cavity of the lid.

13. The method according to claim 12, wherein the second substrate is disposed within the cavity of the lid.

14. The method according to claim 11, further comprising singulating the first substrate, wherein after the singulation, a first die of the plurality of first dies and a second die of the plurality of second dies are attached to a portion of the first substrate that is subsequently bonded to the third substrate.

15. The method according to claim 11, forming a plurality of electrical connectors over the first substrate, each electrical connector of the plurality of electrical connectors being electrically connected to a through via of the plurality of through vias in the first substrate;
wherein the second substrate physically supports the first substrate during the forming of the plurality of electrical connectors.

16. A device, comprising:
a first substrate;
an interposer bonded to the first substrate by a plurality of connectors, wherein an underfill extends along sidewalls of the plurality of connectors and along sidewalls of the interposer;
a first die and a second die bonded to the interposer;
a molding material extending along sidewalls of the first die and the second die, wherein top surfaces of the first die and the second die are exposed through the molding material; and
a second substrate attached to the top surfaces of the first die and the second die that are exposed through the molding material, the second substrate comprising silicon.

17. The device according to claim 16, further comprising:
a heat dissipation lid bonded to the first substrate, wherein the interposer, the first die, the second die, and the second substrate are each disposed within an inner cavity of the heat dissipation lid.

18. The device according to claim 17, further comprising a surface mounted device (SMD) disposed within the inner cavity of the heat dissipation lid.

19. The device according to claim 17, wherein a thermal interface material extends between the first die and the heat dissipation lid, and between the second die and the heat dissipation lid.

20. The device according to claim 16, wherein the interposer comprises a plurality of redistribution layers and a plurality of through vias, and wherein the plurality of redistribution layers are disposed between the plurality of through vias and the first die.

* * * * *